(12) United States Patent
Liang

(10) Patent No.: US 8,742,540 B2
(45) Date of Patent: Jun. 3, 2014

(54) INSULATION LAYER TO IMPROVE CAPACITOR BREAKDOWN VOLTAGE

(75) Inventor: Yao Hsiang Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 933 days.

(21) Appl. No.: 11/216,715

(22) Filed: Aug. 31, 2005

(65) Prior Publication Data
US 2007/0045702 A1    Mar. 1, 2007

(51) Int. Cl.
*H01L 21/02*    (2006.01)
(52) U.S. Cl.
USPC ..... 257/532; 257/303; 257/306; 257/E27.016
(58) Field of Classification Search
USPC ............................ 257/532, 303, 306, E27.016
See application file for complete search history.

(56) References Cited

U.S. PATENT DOCUMENTS

| | | | | |
|---|---|---|---|---|
| 6,037,276 | A * | 3/2000 | Lin et al. ........................ | 438/786 |
| 6,144,051 | A * | 11/2000 | Nishimura et al. ........... | 257/277 |
| 6,430,028 | B1 * | 8/2002 | Kar-Roy et al. ........... | 361/306.3 |
| 6,576,526 | B2 * | 6/2003 | Kai et al. ...................... | 438/393 |
| 6,780,727 | B2 * | 8/2004 | Hwei et al. .................... | 438/393 |
| 7,180,120 | B2 | 2/2007 | Won | |
| 2002/0179951 | A1 * | 12/2002 | Yoshiyama et al. .......... | 257/303 |
| 2003/0146492 | A1 * | 8/2003 | Malinowski et al. ......... | 257/532 |
| 2004/0106266 | A1 * | 6/2004 | Huang et al. ................... | 438/393 |
| 2004/0251514 | A1 * | 12/2004 | Abadeer et al. ............... | 257/532 |
| 2005/0012132 | A1 * | 1/2005 | Tu ................................. | 257/306 |
| 2006/0071301 | A1 * | 4/2006 | Luo et al. ...................... | 257/632 |
| 2006/0154433 | A1 * | 7/2006 | Onoda .......................... | 438/393 |

FOREIGN PATENT DOCUMENTS

| | | |
|---|---|---|
| CN | 1581469 A | 2/2005 |
| KR | 2002-0046002 A | 6/2002 |

OTHER PUBLICATIONS

S.M. Sze, "Physics of Semiconductor Devices", 1981, John Wiley and Sons, Inc., $2^{nd}$ ed., Appendix I.*
Chou, P.F.; Cheng, Y.L.; "A study on the effectiveness of different cap oxides for preventing fluorine out-diffusion from FSG", Apr. 18-20, 2001, VLSI Technology, Systems, and Applications, 2001. Proceedings of Technical Papers. 2001 International Symposium on, pp. 257-260.*

* cited by examiner

*Primary Examiner* — Hsin-Yi Hsieh
(74) *Attorney, Agent, or Firm* — Slater and Matsil, L.L.P.

(57) ABSTRACT

A metal-insulator-metal (MIM) capacitor and a method for forming the same are provided. The MIM capacitor includes an insulator on a bottom metal plate, a top metal plate on the insulator, a dielectric layer on the top metal plate and on at least sidewalls of the top metal plate and the insulator, and an anti-reflective coating (ARC) layer over the top metal plate and the bottom metal plate. The dielectric layer preferably extends on an exposed portion of the bottom metal plate not covered by the top metal plate and the insulator.

16 Claims, 6 Drawing Sheets

INSULATION LAYER TO IMPROVE CAPACITOR BREAKDOWN VOLTAGE

TECHNICAL FIELD

This invention relates generally to semiconductor devices, and more particularly to the structure and manufacturing methods of metal-insulator-metal (MIM) capacitors.

BACKGROUND

Figure 1:
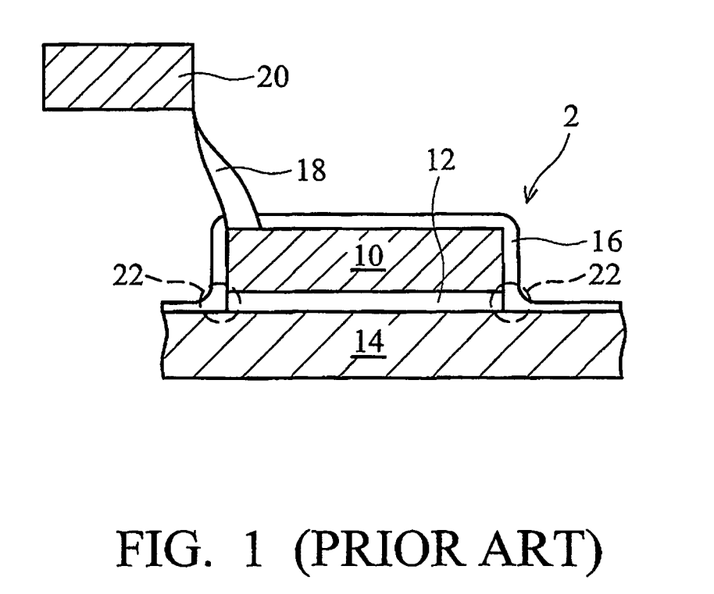
FIG. 1 illustrates a conventional metal-insulator-metal capacitor.

Photolithography techniques are used for fabricating components used in integrated circuits, such as metal-insulator-metal (MIM) capacitors. The MIM capacitors are essentially built-up by forming a multitude of components in a number of layers, one layer on top of another. FIG. 1 illustrates a conventional MIM capacitor 2. The formation processes include forming a bottom metal layer, a top metal layer and an insulation layer therebetween, and etching the top metal layer and the insulation layer to form a top metal plate 10 and an insulator 12, respectively.

It is necessary to ensure that the components in capacitor 2 are accurately positioned and formed. As components get smaller, it is necessary to position and form components to increasingly finer tolerances. For geometries of 0.18 microns and less, accuracy is improved by applying an anti-reflective coating (ARC) layer 16, such as silicon oxynitride (SiON), to the metal layer prior to patterning the bottom metal layer. The ARC layer 16 reduces reflection from the metal layers, allowing more accurate alignment for the formation of the bottom metal plate 14.

In the prior art, the ARC layer 16 is typically not removed because of difficulties in removal processes, thus it remains a part of the MIM capacitor 2.

The ARC layer 16, however, is typically electrically weak and is prone to current leakage and electrical breakdown. For example, a physical void 18 may be formed between the MIM capacitor 2 and a neighboring conductive component 20. The void 18 typically also reveals the path of the leakage current. A leakage current that flows between the top metal plate 10 and the bottom metal plate 14 may occur in regions 22 in the ARC layer 16, so that a breakdown occurs at a low voltage, causing the MIM capacitor 2 to fail.

Accordingly, what is needed is a method that can be used for fabricating MIM capacitors with improved electrical performance. For example, it is desirable to be able to fabricate MIM capacitors that have higher breakdown voltages and reduced leakage currents. It is also desirable to be able to fabricate MIM capacitors for which the variability of these parameters is reduced; that is, it is desirable for the range of values of breakdown voltage and leakage current to fall within a tighter tolerance band. The present invention provides a novel solution to these needs.

SUMMARY OF THE INVENTION

The preferred embodiment of the present invention provides a metal-insulator-metal (MIM) capacitor in integrated circuits and a method for forming the same.

In accordance with one aspect of the present invention, the MIM capacitor includes an insulator on a bottom metal plate, a top metal plate on the insulator, a dielectric layer on the top metal plate and on at least sidewalls of the top metal plate and the insulator, and an anti-reflective coating (ARC) layer over the top metal plate and the bottom metal plate. The dielectric layer preferably extends on an exposed portion of the bottom metal plate not covered by the top metal plate and the insulator.

In accordance with another aspect of the present invention, a method for forming the preferred embodiments of the present invention includes forming a bottom metal layer, forming an insulation layer on the bottom metal layer, forming a top metal layer on the insulation layer, and patterning the top metal layer and the insulation layer to form a top metal plate and an insulator, respectively. The method further includes forming a dielectric layer on the top metal plate and at least sidewalls of the insulator, forming an ARC layer over the top metal layer and the bottom metal layer, and patterning the bottom metal layer to form a bottom metal plate. The dielectric layer preferably extends on an exposed portion of the bottom metal layer The dielectric layer underlying the ARC layer effectively blocks paths of leakage currents between the top and bottom metal plates of the MIM capacitor, as well as the paths of leakage currents between the MIM capacitor and other components in the integrated circuit. Breakdown voltage is also increased.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments are illustrated in FIGS. 2 through 7, wherein like reference numbers are used to designate like elements throughout the various views and illustrative embodiments of the present invention.

Figure 2:
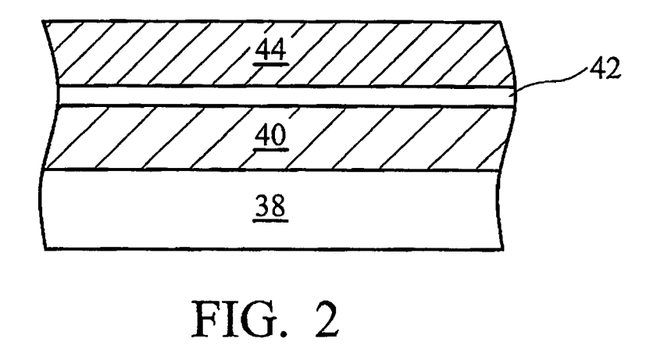
FIGS. 2 through 7 are cross-sectional views of intermediate stages in the manufacture of a preferred embodiment of the present invention.

As illustrated in FIG. 2, stacked layers including an insulation layer 42 on a bottom metal layer 40 and a top metal layer 44 on the insulation layer 42 are formed on a dielectric layer 38. The dielectric layer 38 is preferably an inter-metal dielectric (IMD) layer or an inter-layer dielectric (ILD) layer. A bottom contact or via (not shown) may be formed in the dielectric layer 38 and connects to the bottom metal layer 40.

The top metal layer 44 and bottom metal layer 40 are preferably formed of aluminum. However, other conductive materials, such as copper, tungsten, metal alloys, and metal silicides can also be used. The insulation layer 42 preferably comprises a high-k material, such as silicon oxide and/or silicon oxynitride, and is preferably formed using plasma enhanced chemical vapor deposition (PECVD), although other commonly used methods such as thermal oxidation (such as for forming $Ta_2O_5$) and atomic layer deposition (ALD) (such as for forming ($HfO_2$) can also be used. The insulation layer 42 preferably has a dielectric constant, or k value, of greater than about 3.9. The thickness of the insulation layer 42 is preferably less than about 700 Å, and the resulting capacitor preferably has a unit capacitance of greater than about 1 $fF/mm^2$.

Figure 3:
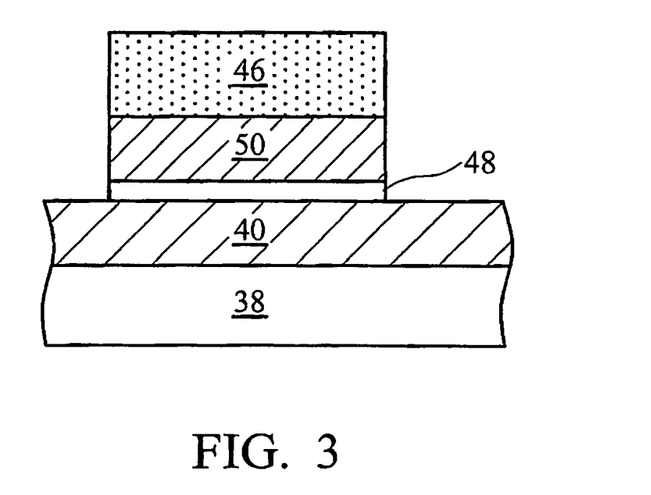

A photo resist 46 is formed on the top metal layer 44 and patterned, as shown in FIG. 3. An etch is performed to remove a portion of the top metal layer 44 and the insulation layer 42, forming a top metal plate 50 and an insulator 48, respectively. The photo resist 46 is then removed.

Figure 4A:
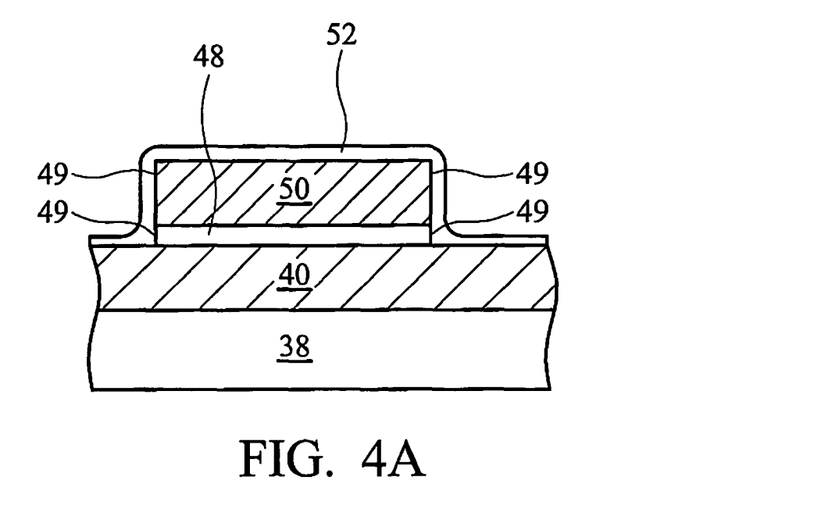

Referring to FIG. 4A, a dielectric layer 52, sometimes referred to as an insulation layer 52, is blanket formed, covering the top metal plate 50, the sidewalls 49 and preferably extending over exposed bottom metal layer 40. The material in the dielectric layer 52 preferably has a higher breakdown voltage than the subsequently formed anti-reflective coating layer, and has a high k value of greater than about 3.5. In the preferred embodiment, the dielectric layer 52 is a silicon-containing oxide layer such as silicon-rich oxide. As a result, there exist relatively strong silicon-oxygen bonds, which require a relatively high electrical field to break. In alternative embodiment, other materials that have a low leakage current and a high breakdown voltage, such as oxide formed using selective area chemical vapor deposition (SACVD) and plasma enhanced tetra ethyl ortho silicate (PETEOS), can be used in the dielectric layer 52. The dielectric layer 52 may have a composite structure comprising more than one sub layer, wherein at least one of the sub layers has a low leakage current and/or a high breakdown voltage.

Figure 4B:
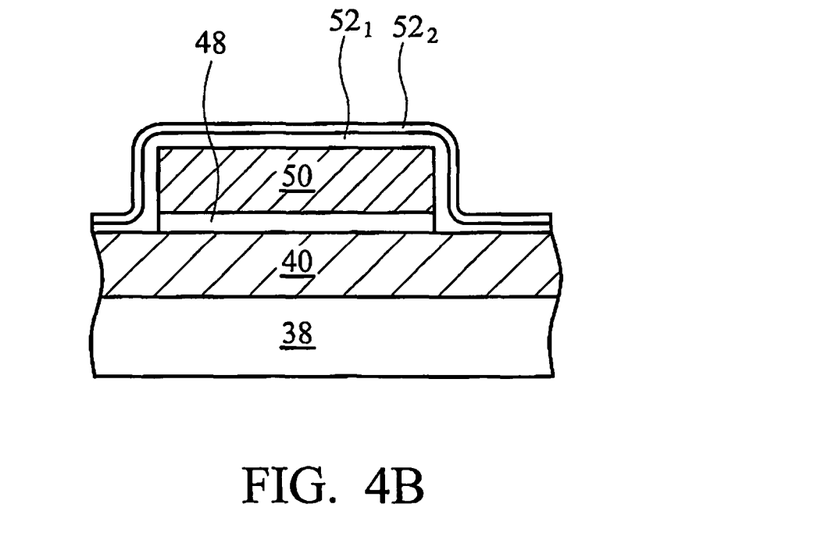

FIG. 4B illustrates that the dielectric layer 52 comprises sub-layers $52_1$, and $52_2$, although more sub-layers can be included. The dielectric layer 52 has a preferred thickness of greater than about 50 Å, and more preferably greater than about 100 Å, and even more preferably between about 100 Å and about 300 Å. One skilled in the art will recognize, however, that the preferred thickness depends upon the technology generation, minimum feature size, and the like, and the values provided do not limit the scope of the present invention. Preferably, the dielectric layer 52 is formed using plasma enhanced CVD (PECVD).

Figure 5:
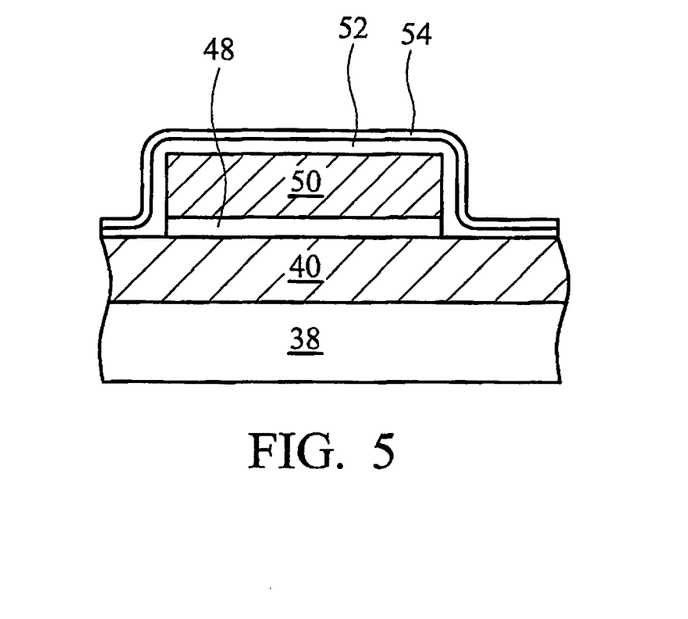

FIG. 5 illustrates the formation of an anti-reflective coating (ARC) layer 54 over the dielectric layer 52. The ARC layer 54 functions to reduce reflection from underlying layers, allowing more accurate alignment. Accordingly, subsequent processes, such as patterning the bottom metal plate, will be accurately positioned. The ARC layer 54 preferably comprises SiON.

Figure 6:
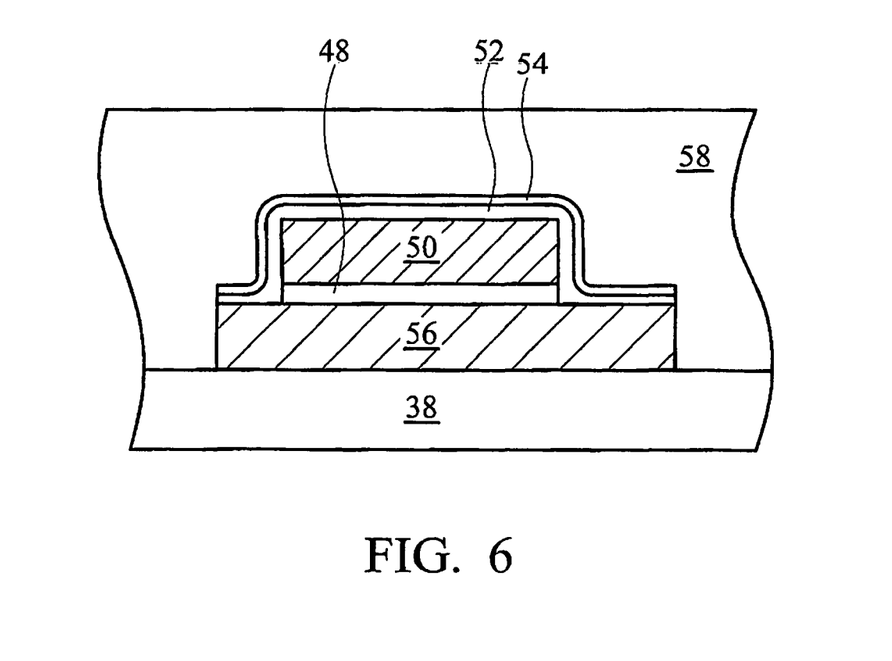

The bottom metal layer 40 is patterned, forming a bottom metal plate 56, as illustrated in FIG. 6. An inter-metal dielectric (IMD) layer 58 covering the previously formed structure is then deposited. The IMD layer 58 is preferably a low-k dielectric deposited using, e.g., tetraethyl ortho silicate (TEOS), CVD, PECVD, low pressure CVD (LPCVD), or other well-known deposition techniques.

Figure 7:
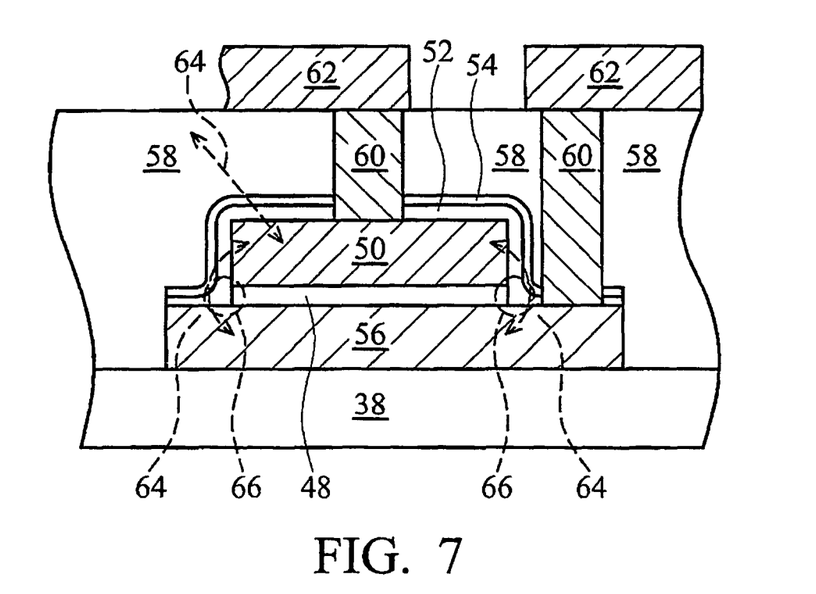

FIG. 7 illustrates a structure after the formation of contact plugs 60. As is known in the art, to form the contact plugs 60, contact openings are formed by etching the IMD layer 58. The contact openings are then filled with conductive materials. Contact plugs 60 may be formed of tungsten, aluminum, copper, or other well-known alternatives. Upper-layer metal lines 62 are then formed, connecting the contact plugs 60.

In the preferred embodiments, the interconnections to the top and bottom metal plates are formed on the top and bottom metal plates in the form of contact plugs. In alternative embodiments, the contact plug to the bottom metal plate 56 may be formed under the bottom metal plate 56.

The dielectric layer 52, which is preferably formed of a silicon-rich oxide, forms an effective barrier layer for the leakage currents. Paths of leakage currents, which are symbolized as bi-directional arrows 64, are blocked by the dielectric layer 52.

Capacitor failure caused by electrical breakdown is also significantly reduced. Regions 66, which are prone to electrical breakdown, are now formed of materials that can endure higher voltages without being broken down. A possible reason is that the Si—O bonds, which are extant in the silicon-rich oxide, are stronger than Si—H bonds and N-H bonds. Therefore, a higher electrical field is required to break down the dielectric layer 52 than to break down the ARC layer 54.

Figure 8:
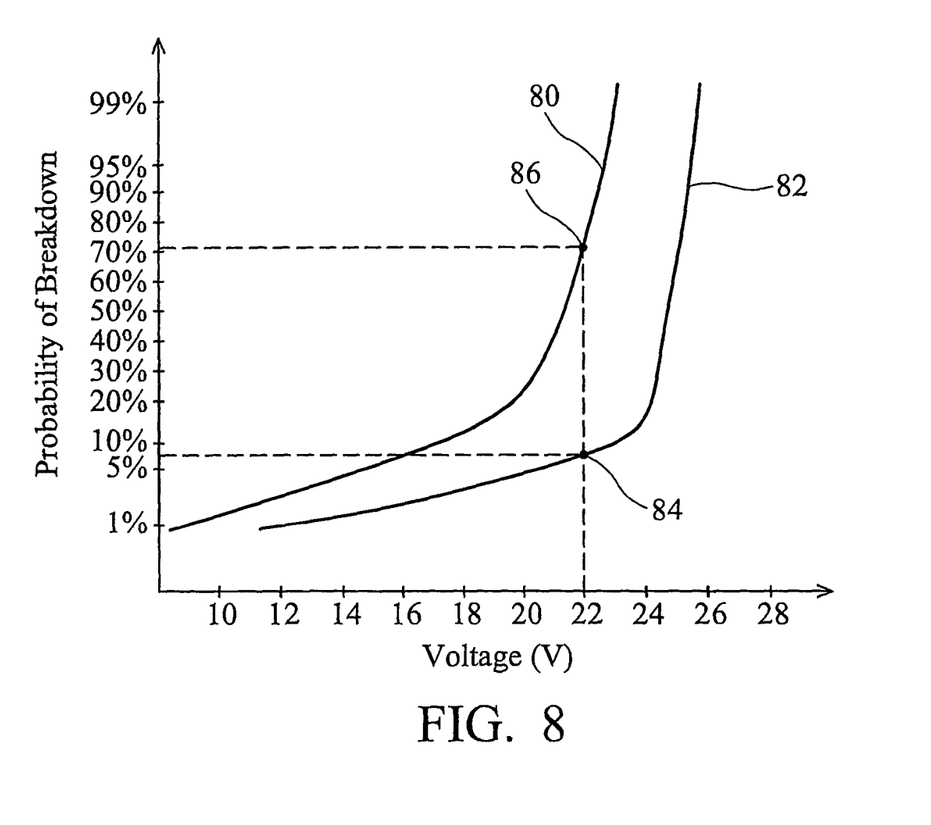
FIG. 8 illustrates improvement of the preferred embodiments of the present invention over prior art devices, wherein the probability of breakdown of the capacitors is shown as a fraction of the applied voltage.

Experiment data comparing the preferred embodiments of the present invention and prior art capacitors is shown in FIG. 8, which illustrates probabilities of capacitor breakdown as a function of voltages applied between the top metal plate 50 and bottom metal plate 56. Multiple capacitors were tested, each applied with a test voltage that increased until the capacitor failed. Line 80 shows the probability of breakdown of conventional MIM capacitors, which comprise no dielectric layer 52. Line 82 shows the probability of breakdown of a preferred embodiment capacitor of the present invention. It is noted that when the test voltages increased to about 22V, about 73 percent (point 86) of conventional devices failed, while the preferred embodiment devices only had about a 7 percent (point 84) failure rate.

It is noted that even when the applied voltages are small, such as in the range of less than about 20 volts, the breakdown probability of conventional MIM capacitors still increases relatively rapidly with respect to the applied voltages. This indicates that the prior art devices have to be operated at very low voltages, and any noticeable voltage increase causes a higher probability of breakdown. The conventional devices, therefore, are more likely to be damaged by voltage surges. The probability of breakdown in the preferred embodiment devices of the present invention, however, increases much more slowly at a low voltage range, creating a wide work range. When the applied voltage increases, the probability of breakdown increases much less rapidly than the conventional MIM capacitors, indicating that the preferred embodiments of the present invention are more reliable, and less likely to be damaged by voltage surges.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a bottom metal plate;

an insulator on the bottom metal plate;

a top metal plate on the insulator;

a dielectric layer on the top metal plate and on at least sidewalls of the top metal plate and the insulator, wherein the dielectric layer comprises more than one sub layer, each sub layer on at least the sidewalls of the top metal plate and the insulator, at least one of the sub layers having a different material composition than another of the sub layers; and an anti-reflective coating (ARC) layer over the dielectric layer.

2. The semiconductor device of claim 1 wherein the ARC layer extends on an exposed portion of the bottom metal plate not covered by the top metal plate and the insulator.

3. The semiconductor device of claim 1 wherein the dielectric layer further extends on an exposed portion of the bottom metal plate.

4. The semiconductor device of claim 1 wherein the dielectric layer has a k value of greater than about 3.5.

5. The semiconductor device of claim 1 wherein the dielectric layer comprises silicon-oxygen bonding.

6. The semiconductor device of claim 5 wherein the dielectric layer comprises silicon-rich oxide.

7. The semiconductor device of claim 1 wherein the dielectric layer comprises a material having a higher breakdown voltage than the ARC layer.

8. The semiconductor device of claim 1 wherein the dielectric layer comprises a material having a lower current leakage than the ARC layer.

9. The semiconductor device of claim 1 wherein the ARC layer comprises SiON.

10. A capacitor having a metal-insulator-metal structure, the capacitor comprising:

a top metal plate and a bottom metal plate having an insulator therebetween, wherein the top metal plate and the insulator substantially overlap, and wherein the bottom metal plate has an exposed portion not covered by the top metal plate and the insulator;

an anti-reflective coating (ARC) layer over the top metal plate, sidewalls of the top metal plate and the insulator, and the exposed portion of the bottom metal plate;

a silicon-containing oxide dielectric layer separating the ARC layer from the top metal plate, the insulator and the bottom metal plate, wherein the silicon-containing oxide dielectric layer comprises a material having a higher breakdown voltage than a material in the ARC layer;

a first contact over and electrically connected to the top metal plate; and a second contact over and electrically connected to the bottom metal plate, wherein the first and the second contacts penetrate through the ARC layer and the silicon-containing oxide dielectric layer.

11. The capacitor of claim 10 wherein the silicon-containing oxide dielectric layer comprises silicon oxide.

12. The capacitor of claim 10 wherein the silicon-containing oxide dielectric layer has a thickness of greater than about 50 Å.

13. The capacitor of claim 10 wherein the silicon-containing oxide dielectric layer has a k value of greater than about 3.5.

14. The capacitor of claim 10 wherein the ARC layer comprises SiON.

15. The capacitor of claim 10 having a unit capacitance of greater than about 1 fF/mm$^2$.

16. The semiconductor device of claim 1 further comprising:

a first contact over and electrically connected to the top metal plate; and a second contact over and electrically connected to the bottom metal plate, wherein the first and the second contacts penetrate through the ARC layer.

\* \* \* \* \*

UNITED STATES PATENT AND TRADEMARK OFFICE
CERTIFICATE OF CORRECTION

| | | |
|---|---|---|
| PATENT NO. | : 8,742,540 B2 | Page 1 of 1 |
| APPLICATION NO. | : 11/216715 | |
| DATED | : June 3, 2014 | |
| INVENTOR(S) | : Liang | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1066 days.

Signed and Sealed this
Eleventh Day of August, 2015

Michelle K. Lee
*Director of the United States Patent and Trademark Office*